(12) United States Patent
Dietze et al.

(10) Patent No.: US 10,722,925 B2
(45) Date of Patent: Jul. 28, 2020

(54) TREATMENT HEAD, TREATMENT SYSTEM AND METHOD FOR TREATING A LOCAL SURFACE AREA OF A SUBSTRATE

(71) Applicant: SUSS MIRCROTEC PHOTOMASK EQUIPMENT GMBH & CO. KG, Sternenfels (DE)

(72) Inventors: Uwe Dietze, Corona, CA (US); Martin Samayoa, Corona, CA (US)

(73) Assignee: SUSS MICRO TEC PHOTOMASK EQUIPMENT GMBH & CO KG, Sternenfels (DE)

( * ) Notice: Subject to any disclaimer, the term of this patent is extended or adjusted under 35 U.S.C. 154(b) by 186 days.

(21) Appl. No.: 15/830,151

(22) Filed: Dec. 4, 2017

(65) Prior Publication Data
US 2019/0168269 A1   Jun. 6, 2019

(51) Int. Cl.
| B08B 5/02 | (2006.01) |
| B08B 7/00 | (2006.01) |
| G03F 7/20 | (2006.01) |
| B08B 15/04 | (2006.01) |
| H01J 37/00 | (2006.01) |
| G03F 7/00 | (2006.01) |
| H05H 1/46 | (2006.01) |

(52) U.S. Cl.
CPC ............ *B08B 5/023* (2013.01); *B08B 7/0071* (2013.01); *B08B 15/04* (2013.01); *G03F 7/0002* (2013.01); *G03F 7/70925* (2013.01); *H01J 37/00* (2013.01); *B08B 2205/005* (2013.01); *H05H 1/46* (2013.01); *H05H 2245/123* (2013.01)

(58) Field of Classification Search
None
See application file for complete search history.

(56) References Cited

U.S. PATENT DOCUMENTS

| 2009/0186167 A1 | 7/2009 | Tsuji et al. |
| 2015/0270119 A1 | 9/2015 | Yahata |
| 2015/0294866 A1* | 10/2015 | Okumura .............. H01L 21/324 438/798 |

FOREIGN PATENT DOCUMENTS

EP   2056164   5/2009

* cited by examiner

*Primary Examiner* — Kishor Mayekar
(74) *Attorney, Agent, or Firm* — Tarolli, Sundheim, Covell & Tummino LLP

(57) ABSTRACT

A treatment head for treating a surface area of a substrate includes a housing having a main surface configured to be arranged adjacent to and facing the surface area of the substrate to be treated. An exhaust opening in the main surface of the housing is connectable to an exhaust device via an exhaust gas path formed at least in part in the housing. A radiative heater is arranged in the housing to emit heat radiation through a radiation opening in the main surface. A plasma source is arranged in the housing to emit a plasma jet through a plasma exit opening in the main surface. An outlet opening in the main surface of the housing is connectable to a gas source via an gas path formed at least in part in the housing. The centers of the exhaust opening, the radiation opening, the plasma exit opening, and the outlet opening are arranged in the above order along a first direction of the main surface.

26 Claims, 11 Drawing Sheets

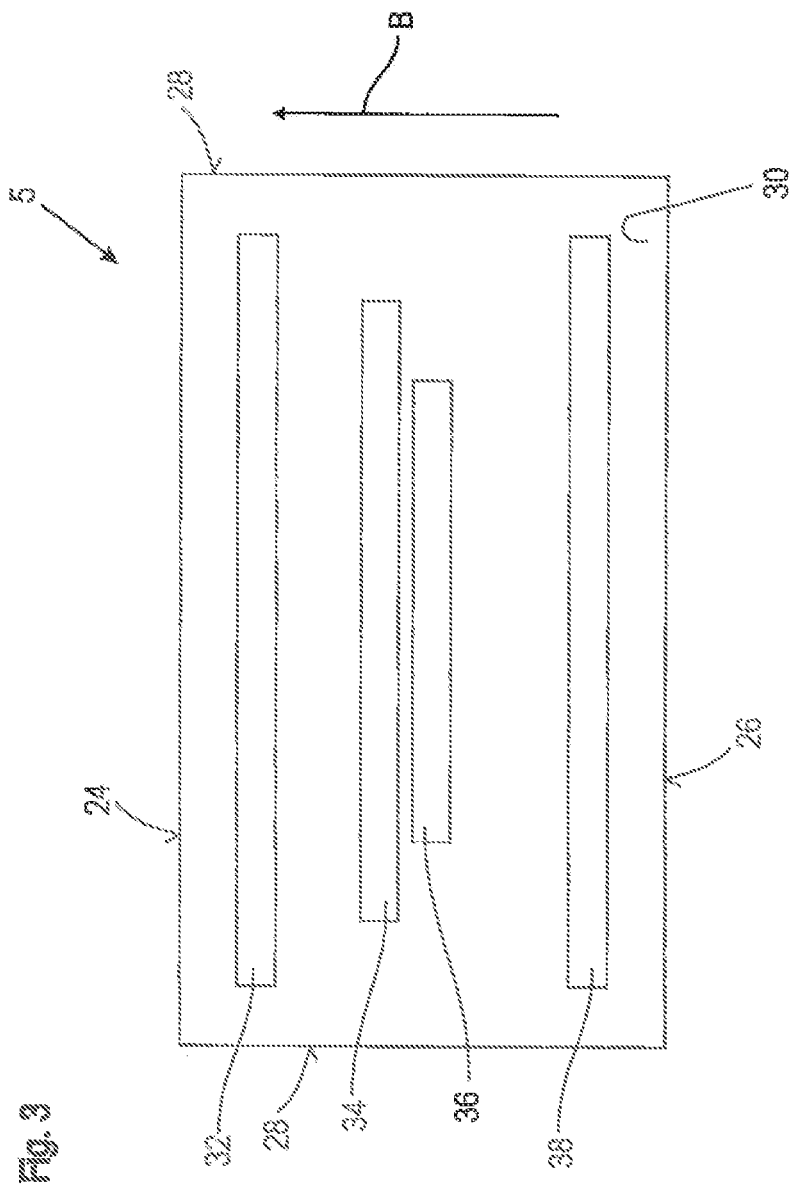

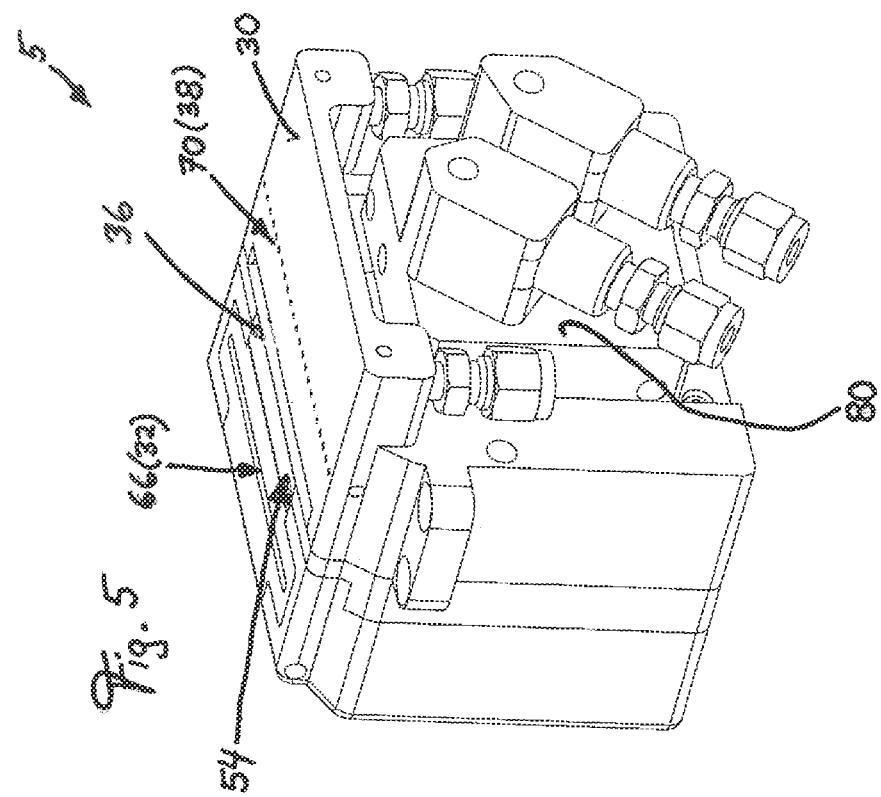
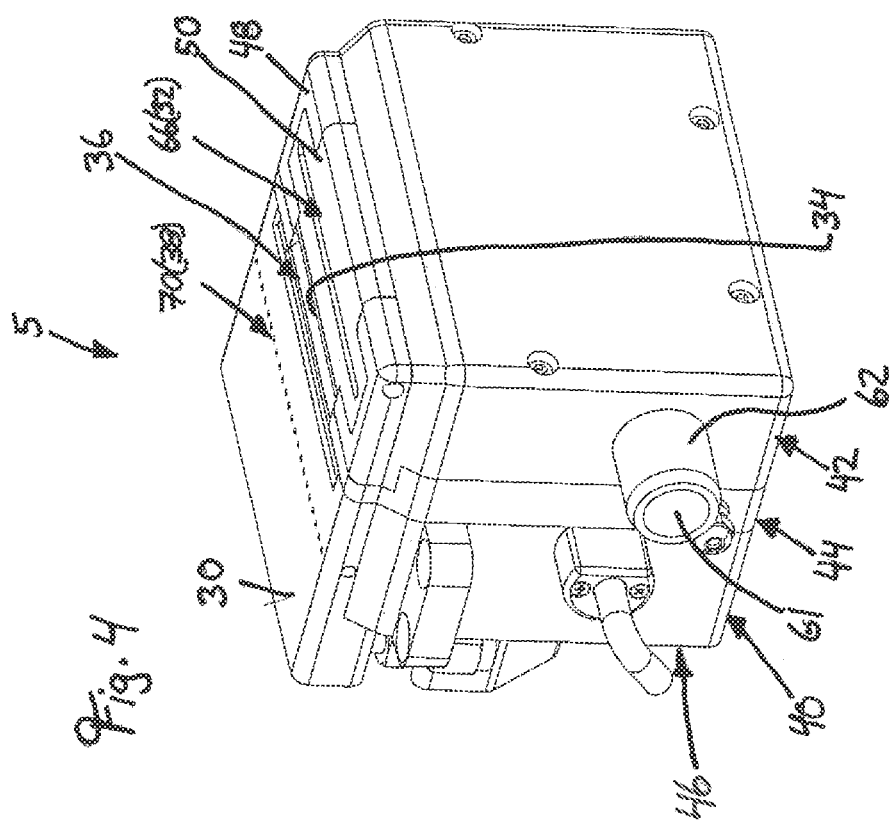

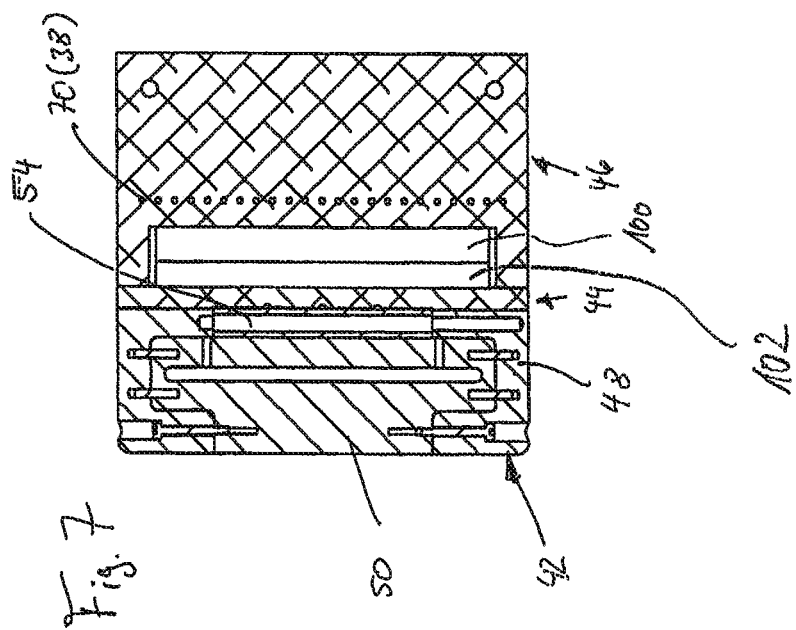
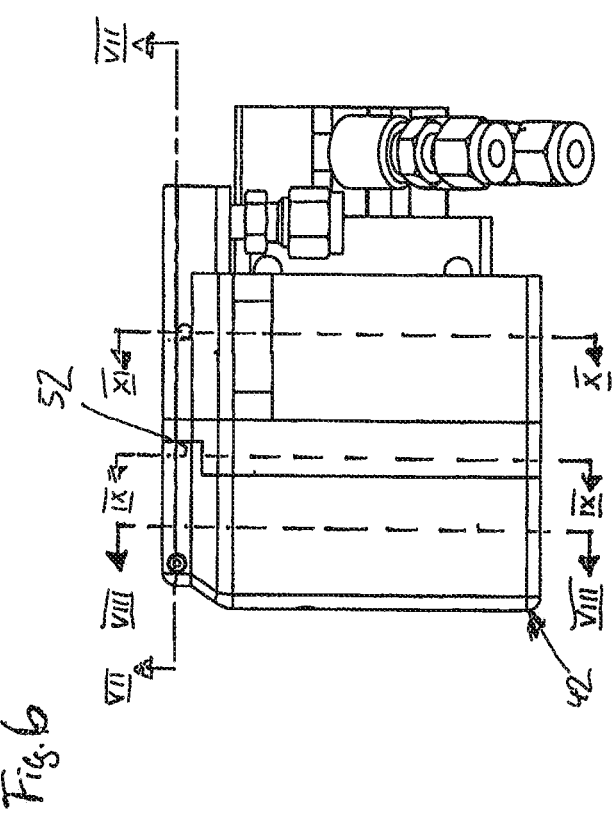

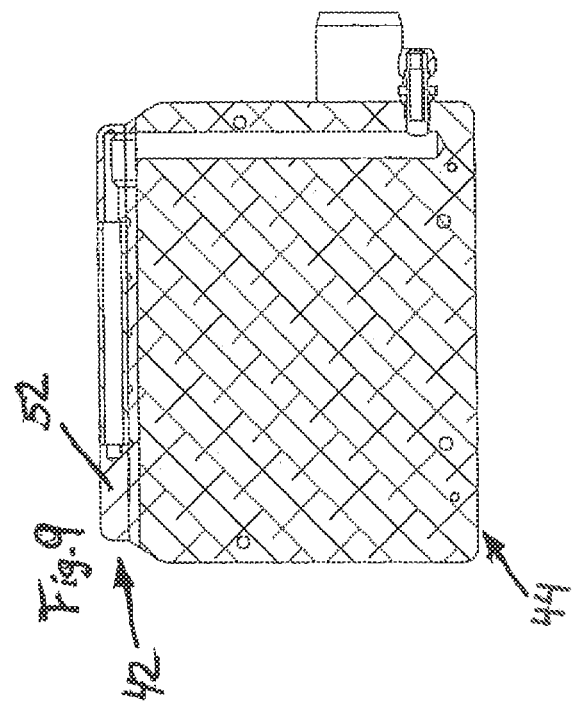
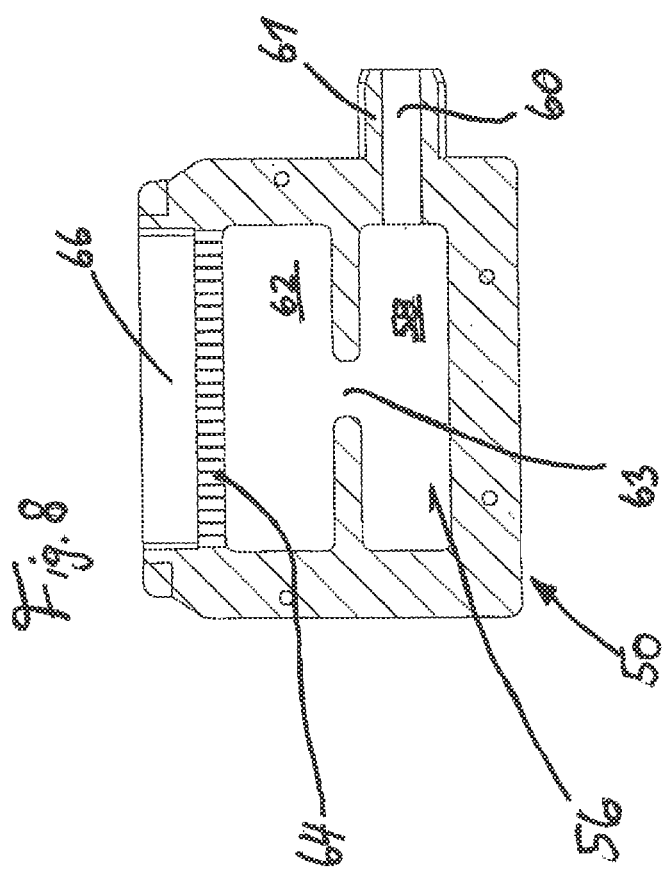

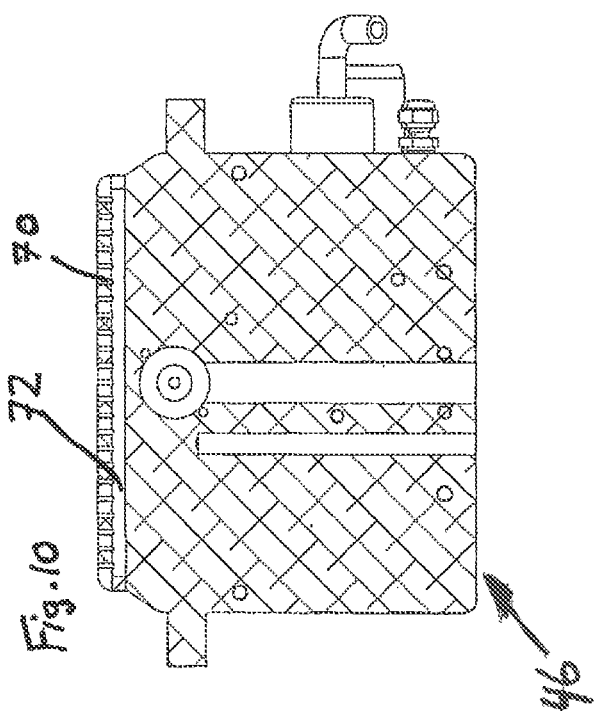

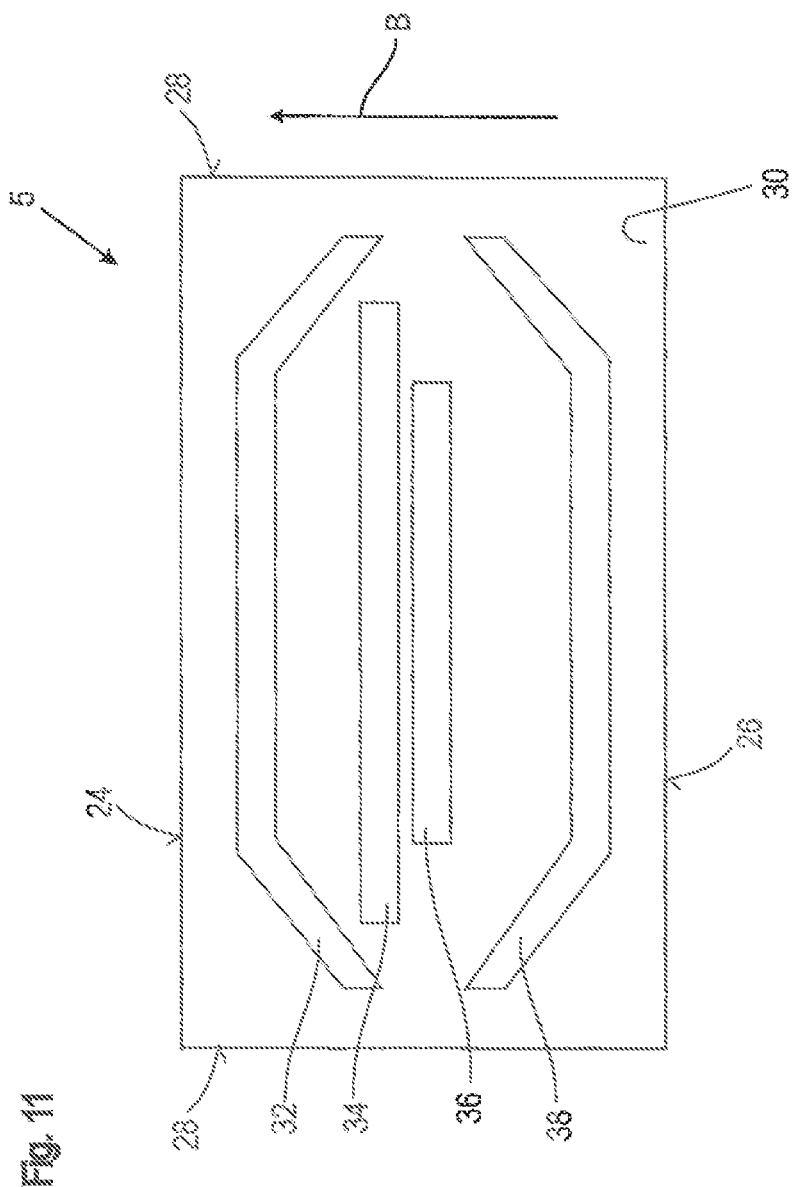

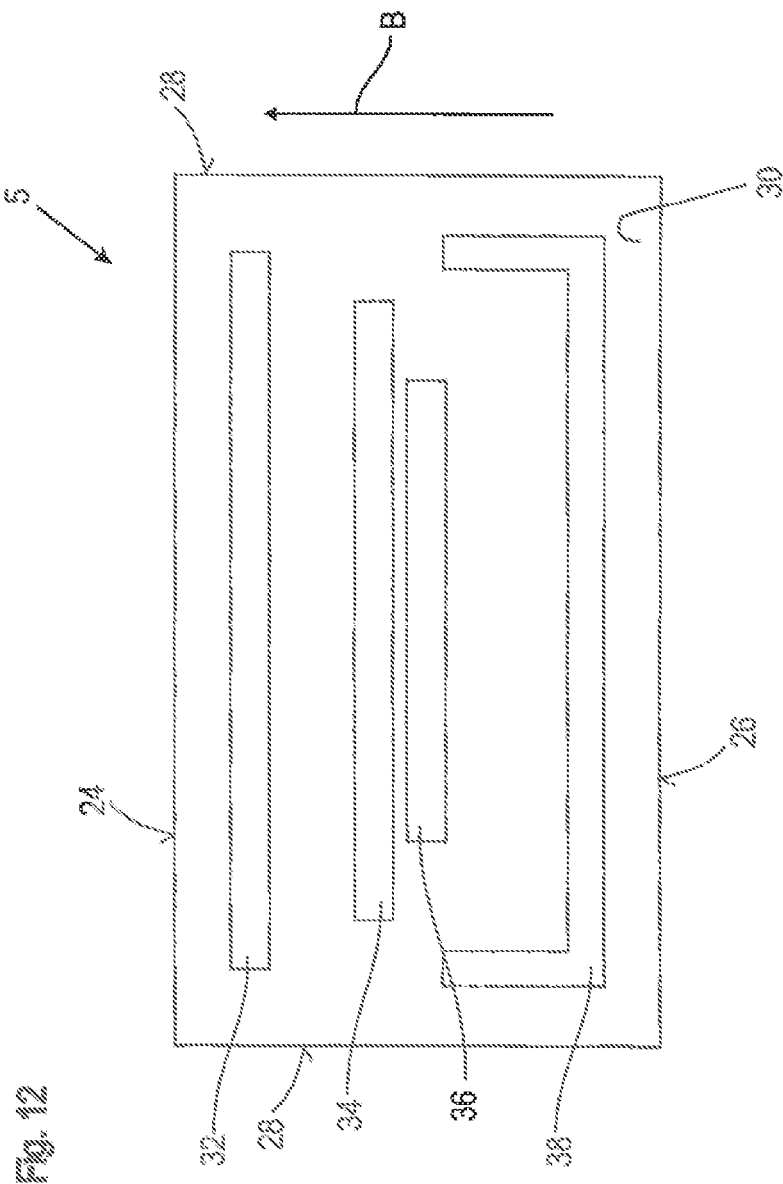

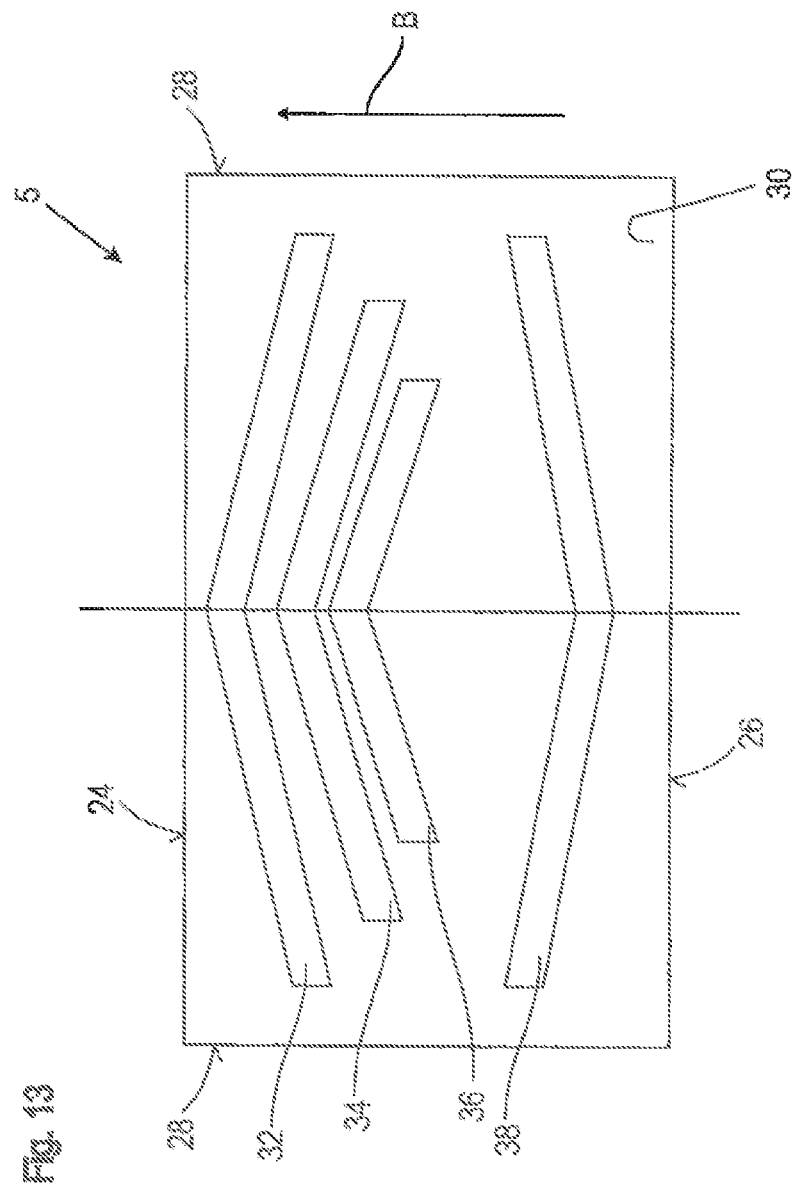

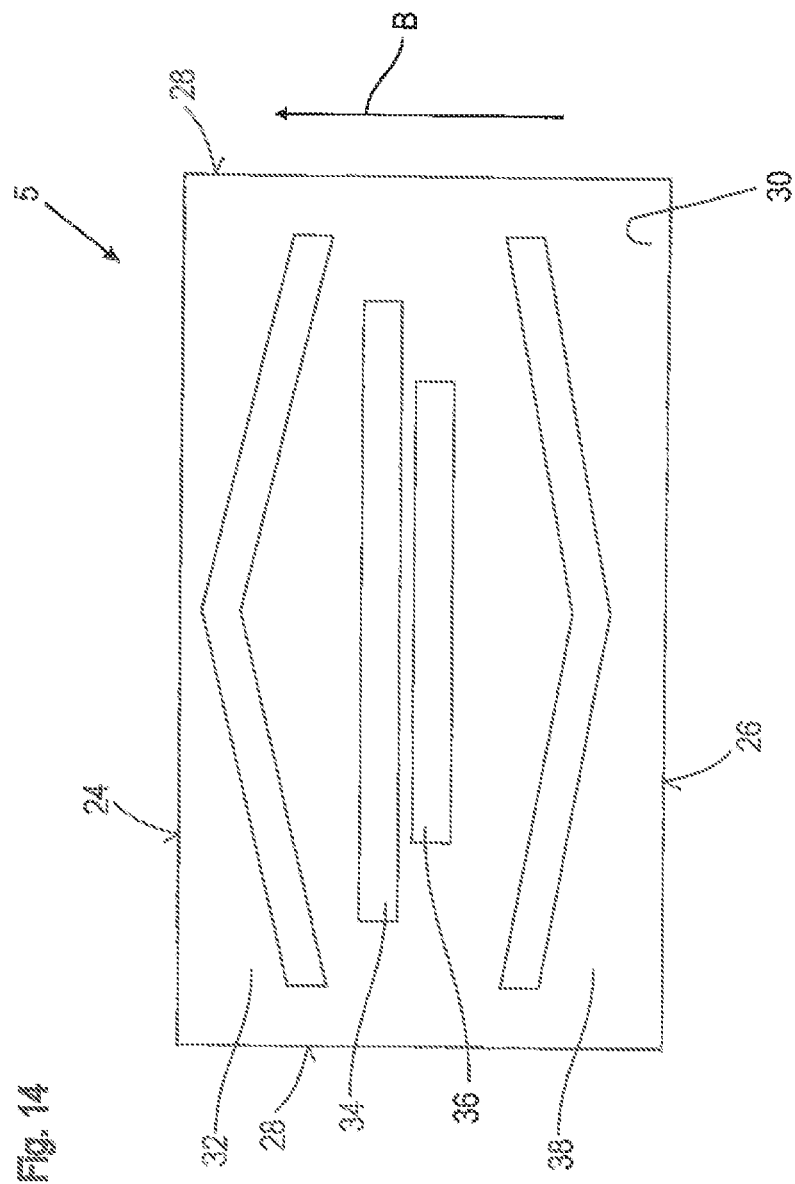

TREATMENT HEAD, TREATMENT SYSTEM AND METHOD FOR TREATING A LOCAL SURFACE AREA OF A SUBSTRATE

TECHNICAL FIELD

The present invention relates to a treatment head, a treatment system and a method for treating a local surface area of a substrate using a plasma. As a preferred treatment, the removal of contaminants from substrates is mentioned.

The treatment head, treatment system and method are particularly applicable to the removal of contaminants from templates used in nanoimprint lithography, but may also be used for other technologies requiring a plasma treatment in a controlled environment.

BACKGROUND

Nanoimprint lithography is a well-known technique for fabricating nanometer scale relief patterns using patterned templates, which are also called masks or molds. The templates are used for imprinting a pattern into a suitable material, such as a liquid resist. The material may then solidify while still in contact with the template, which is removed after the solidification. When removing the template, particles may adhere to the template surface. During the nanoimprint lithography process, the template comes into direct contact with the resist on the substrate. Therefore, template cleanliness plays an important role in imprinted substrate quality. Furthermore, if the template has any form of a defect such as resist residue, stains, particles, surface scratches, chipping, bumping, etc., it can lead to poor quality imprints, low yield and throughput decreases. Hence, any periodic cleaning of the templates should preferably be efficient in removing contaminants and should avoid any damages to the surface of the templates.

In the past, chemical cleaning strategies have been used, which may be problematic as discussed in S. Singh et al. "Effects of Cleaning on NIL Templates: Surface Roughness, CD and Pattern Integrity" in the Proc. of SPIE Vol. 8166 81662P-1, or Zhang et al in "Mask cleaning in EUV and Nano-Imprint Lithography" China Semiconductor Technology International Conference 2010, ECS Transactions 27(1) 467-472.

EP 2 056 164 A1 describes a cleaning apparatus using plasma radicals for the cleaning of substrates in an immersion lithographic apparatus. In particular, atmospheric plasma cleaning is described in which plasma radicals are generated in a plasma radical source and then directed in a gas flow, via a conduit, to an outlet which is directed towards a contaminated surface. To restrict the plasma radicals to a localized region of the surface to be cleaned, one or more suction openings are provided adjacent the outlet. The suction openings are connected to an under-pressure source to exhaust gases and radicals directed onto the surface to be cleaned via the outlet together with any gases which are drawn into the suction openings from the immediate surroundings thereof.

Further examples of apparatuses and methods using plasma excited gases for cleaning purposes are shown in U.S. Pat. No. 2,015,270 119 A1 or US 2009 186 167.

SUMMARY

An object of the invention is to advance the art of substrate treatment, in particular, but not exclusive to, the removal of contaminants from a substrate surface using a plasma.

In one aspect of the disclosure, a treatment head for treating the surface area of a substrate comprises a housing having a main surface configured to be adjacent to and facing the surface area of the substrate to be treated, an exhaust opening in the main surface of the housing, the exhaust gas opening being connectable to an exhaust device via an exhaust gas path formed at least in part in the housing, a radiative heater arranged in the housing to emit heat radiation through a radiation opening in the main surface, a plasma source arranged in the housing to emit a plasma jet through a plasma exit opening in the main surface, and an outlet opening in the main surface of the housing, the outlet opening being connectable to a gas source via an gas path formed at least in part in the housing. The centers of the exhaust opening, the radiation opening, the plasma exit opening and the outlet opening are arranged in the above order along a first direction of the main surface of the housing. Such a treatment head may provide an effective surface treatment using a plasma within a controlled local environment.

In a further aspect, the exhaust opening, the radiation opening, the plasma exit opening and the outlet opening may each have a width in the first direction of the main surface and a length in a second direction of the main surface, wherein the second direction is perpendicular to the first direction, and wherein the length of the respective openings are larger than their respective width. The exhaust opening, the radiation opening, the plasma exit opening and the outlet opening may be formed by a single opening or a plurality of openings. The length of the openings is defined as the distance between the outer ends of the respective single opening or the outer ends of the outer openings of the plurality of openings in the second direction and the width is defined as the maximum distance between the outer ends of the respective openings in the first direction.

The extension of the main surface in the second direction may be larger, preferably at least 10 mm larger, than the extension of the largest opening in the second direction. The extension of the main surface in the first direction may be larger, preferably at least 10 mm larger, than the distance between the exhaust opening and the outlet opening in the first direction. Thus, a continuous annular edge region of the main surface may be provided, which radially surrounds a central area of the main surface in which the respective openings are formed.

According to one aspect, at least one exhaust opening and outlet opening is formed by a plurality of openings arranged adjacent each other. For providing a confining gas flow with respect to a plasma region, both the exhaust opening and the outlet opening may each have a length in a second direction perpendicular to the first direction, which is longer than the length of the plasma exit opening in the second direction. At least a center section of the exhaust opening, the radiation opening, the plasma exit opening and the outlet opening may extend parallel to each other in the second direction, the center section having a length corresponding to the length of the plasma exit opening.

In another aspect, at least one of the exhaust openings and outlet openings may at least partially overlap at least one of the radiation openings and the plasma exit opening in the first direction. Such overlap may help in confining a gas flow. At least one of the exhaust openings and outlet openings may have a U-shape, a V-shape or a combination thereof.

In accordance with one aspect, the main surface of the housing may be substantially flat. In another aspect, the surface contour of the main surface of the housing may be matching the surface contour of the substrate surface.

The radiative heater and the radiation opening may be arranged such that at least part of the radiation exiting the radiation opening is inclined in the direction of the plasma exit opening. This may facilitate localized heating of an area of the substrate surface onto which, during treatment, a plasma or radicals/metastables generated in the plasma is/are directed.

The main surface of the treatment head may have an extension in a second direction perpendicular to the first direction which is larger than the extension of the surface area to be cleaned in the second direction. This may enable cleaning the surface of the substrate by moving the treatment head in the first direction over the surface area to be cleaned in a single pass. The treatment head may be configured to clean the surface area of the substrate, wherein the radiative heater and the plasma source are configured to locally provide sufficient heat and plasma energy to decompose any matter to be removed from the surface area to be cleaned.

In another aspect, a treatment system for treating a surface area of the substrate may comprise a treatment head having one or more of the previously described features, a holder for holding the substrate to be treated, and a movement mechanism configured to move at least one of the holders and treatment head to place the treatment head in close proximity to a surface area of the substrate to be treated and to provide a scanning movement between the treatment head and the substrate to be treated at least along a main scan direction corresponding to the first direction of the main surface of the housing of the treatment head and in substance parallel to the surface of the substrate to be treated.

In the system, the holder may be configured to hold the substrate such that the surface area to be treated faces downward and is freely accessible, however, other orientations are also possible.

In one aspect, the movement mechanism is configured to move the holder along the main scan direction.

In accordance with a further aspect, a method for treating a local surface area of a substrate comprises placing a treatment head having a main surface adjacent to and facing the local surface area of the substrate to be treated, such that a substantially uniform gap is formed between the surface and the local surface area to be cleaned, providing a scanning movement along a scan direction between the cleaning head and the substrate to be cleaned while maintaining the gap, treating the local surface area during the movement along the scan direction by sequentially exposing the surface to be cleaned in the gap in the given order to a gas flow into an exhaust opening provided in the main surface of the treatment head, the gas flow causing a suction force on the surface to be treated, radiative heat emitted from a radiation opening provided in the main surface of the treatment head towards the substrate to be treated, the radiative heat causing local heating of the surface to be treated, a plasma jet emitted from a plasma exit opening provided in the main surface of the treatment head towards the surface to be cleaned, and a purge gas flow provided from an outlet opening provided in the main surface of the treatment head into the gap. The method preferably uses a treatment head or a treatment system having one or more of the previously described features.

In one aspect, the gas flow into the exhaust opening and the purge gas flow from the outlet opening are controlled to capture all of the gas flow emitted by the plasma jet.

For ensuring a controlled local treatment environment the gap may preferably be controlled to be between 0.1 mm and 2 mm. Furthermore, the movement of the treatment head may be controlled such that during the treatment, the main surface of the head does not move beyond the substrate surface or a surface extension, which is an element provided adjacent the substrate, and which forms a substantially flush surface with the surface to be treated of the substrate.

In one aspect, the treatment is a cleaning of a local surface area of a substrate and the radiative heat and the plasma jet are controlled to locally provide sufficient heat and plasma energy to decompose the matter to be removed from the local surface area to be cleaned. The method may be and used for cleaning the mesa area of a mask for nanoimprint lithography.

In accordance with one aspect, the treatment is one of a deoxygenation and passivation using at least one of hydrogen and nitrogen as gas for forming the plasma jet. The treatment may also be an oxidation process by means of Ozone, which is generated using oxygen as gas for forming the plasma jet. In another aspect, the treatment may be a high energy decomposition process by means of metastables, which are generated using Helium, Argon, Nitrogen or a mix of those gases for forming the plasma jet.

The foregoing discussion of certain aspects of the disclosure is for illustrative purposes only. Various aspects of the present technology may be more clearly understood and appreciated from a review of the following text and by reference to the associated drawings and the claims that follow. Other aspects, systems, methods, features, advantages, and objects of the present technology will become apparent to one with skill in the art upon examination of the following drawings and text. It is intended that all such aspects, systems, methods, features, advantages, and objects are to be included within this description and covered by this application and by the appended claims of the application.

BRIEF DESCRIPTION OF THE DRAWINGS

The invention will be described in more detail herein below with respect to the drawings. In the drawings:

FIG. 3 shows a schematic bottom view of a treatment head of the treatment system of FIG. 1;

FIG. 4 shows a perspective side-bottom view of a treatment head according to an embodiment, which may be used in a treatment system as the one shown in FIG. 1 or similar systems;

FIG. 5 shows a perspective end-bottom view of the treatment head of FIG. 4;

FIG. 6 shows side view of the cleaning head of FIG. 4;

FIG. 7 shows a sectional view of the cleaning head along the line VII-VII in FIG. 6;

FIG. 8 shows a sectional view of the cleaning head along the line VIII-VIII in FIG. 6;

FIG. 9 shows a sectional view of the cleaning head along the line IX-IX in FIG. 6;

FIG. 10 shows a sectional view of the cleaning head along the line X-X in FIG. 6.

FIGS. 11-14 shows schematic bottom views illustrating different arrangements of a treatment head of the treatment system of FIG. 1.

DESCRIPTION OF PREFERRED EMBODIMENTS

Figure 1:
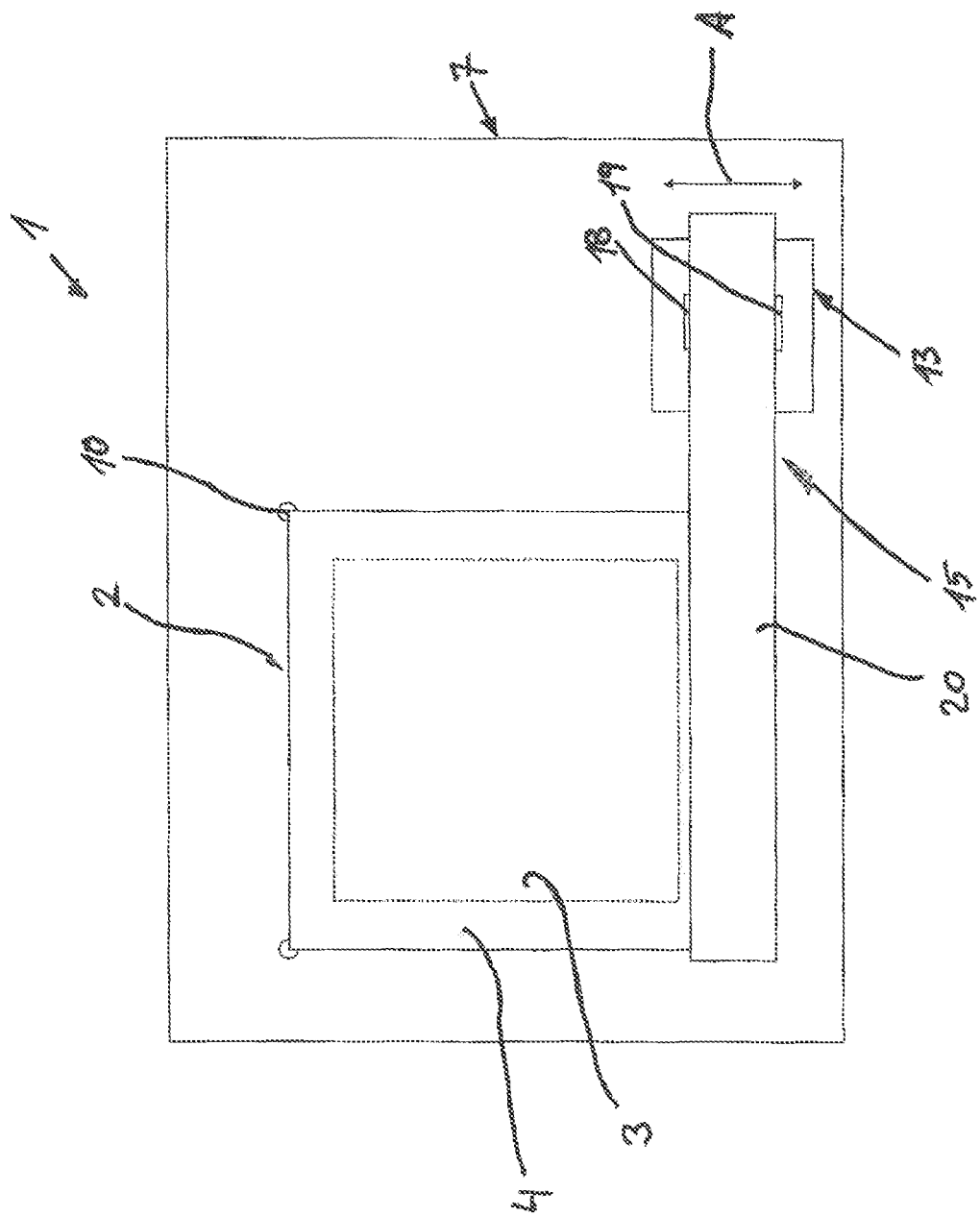
FIG. 1 shows a schematic top view of a treatment system for treating a surface of a substrate.

For purposes of illustration, embodiments of the invention will be described as applied to the cleaning of a template for lithography, and in particular, for cleaning the mesa area of a template for nanoimprint lithography, although it will become apparent that they could also be applied to the cleaning of different substrates or for other plasma treatments of a substrate surface such as surface passivation or other processes in which properties of the surface are changed using, in part, a plasma. The mesa area of a template for nanoimprint lithography is the area that comes into direct contact with the resist, and resist particles may adhere to this area, which could impair the functionality of the template. Such resist particles are seen as contaminations which should be removed during a cleaning process without damaging the delicate structure of the mesa area.

Directional phrases used herein, such as left, right, top, bottom, up, down, vertical horizontal and derivatives thereof, relate to the orientation of the elements shown in the drawings and are not limiting upon the claims unless expressly recited therein.

Figure 2:
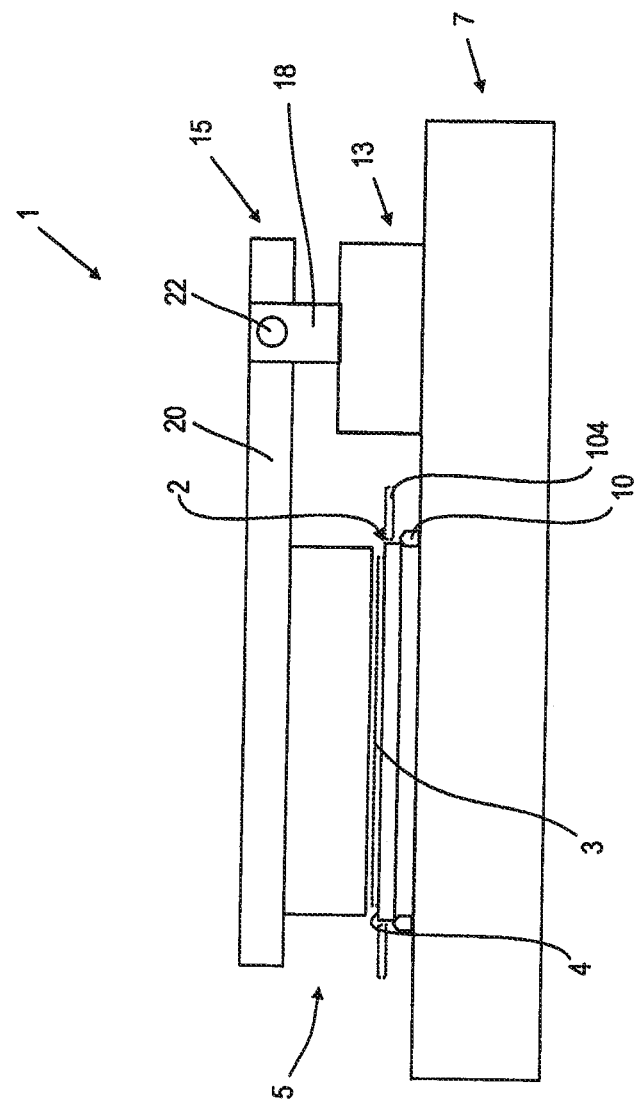
FIG. 2 shows a schematic side view of the treatment system of FIG. 1.

FIG. 1 shows a schematic top view of a cleaning apparatus 1 for cleaning a surface of a substrate 2, and FIG. 2 shows a schematic side view of the cleaning apparatus 1. The cleaning apparatus 1 has a support structure for supporting the substrate 2 and for supporting a cleaning head 5.

In the embodiment as shown, the substrate 2 is a template (sometimes also called mask of mold) for nanoimprint lithography having a central patterned region 3, also called a mesa, as indicated by the broken line in FIGS. 1 and 2, and an edge region 4 surrounding the patterned region 3. The patterned region 3 is typically slightly raised with respect to the edge region 4. Both the apparatus as shown and the method as described herein below, however, may be used in combination with other types of substrates, which may be treated, in particular cleaned, using in part a plasma.

The support structure has a base 7 of, for example, a rectangular shape as seen in the top view of FIG. 1. The base 7 has four support pins 10 for receiving the substrate 2, thereon. The support pins 10 are arranged to contact the substrate 2 at its corners and may have angled surfaces which provide a centring of the substrate 2 with respect to the support pins and furthermore allow contacting of the template at its lower edges only. The substrate 2 may be placed on the support pins such that the surface to be cleaned faces upwards and is in substance horizontally aligned. The skilled person will realize that other support structures for receiving and holding a substrate in a cleaning position may be provided. In particular, support structures for holding the substrate in an upside down fashion may be taken in consideration. A surface extension 104, which is an element provided adjacent the substrate 2, may be provided as shown by the dotted line in FIG. 2.

The support structure further has a movable platform 13 and a holder 15 for supporting the cleaning head 5 in a movable manner. The movable platform 13 is movable along a linear direction along an edge of a receiving space defined by the support pins 10. The double headed arrow A in FIG. 1 indicates the direction of movement of the platform 13. The platform 13 may be moved along the linear direction by any suitable drive mechanism and respective guides for guiding the linear movement may be provided.

The holder 15 is attached to the platform 13 to be movable therewith. The holder 15 as shown here is made up of a U-shaped bracket 18 and a carrier arm 20. The bracket 18 has a base (not shown) mounted to the platform 13 and two arms 19 extending away from the platform 13. The arms 19 extend in substance parallel to each other and are spaced to receive the carrier arm 20 therebetween. The holder 15 further has a swivel pin 22, which extends between the arms 18 and through the carrier arm 20 received therebetween, to thereby pivotally mount the carrier arm 20 to the bracket 18. It should be noted that the described structure for pivotally mounting the carrier arm 20 to the platform 13 is only a simplified example and that many other structures may be provided to mount the carrier arm 20 to the platform 13.

The carrier arm 20 has a substantially straight and elongated shape. It is held by the holder 15 to extend over the substrate 2 when received on the support pins 10. The cleaning head 5 is mounted to a lower side of the carrier such that it may be supported over the substrate 2 when received on the support pins 10. The carrier arm 20 may be pivoted around the swivel pin to allow movement of the cleaning head towards and away from the substrate 2 to allow easier access thereto. The movable platform 13 and a holder 15 are designed to arrange the cleaning head 5 such that it is held in a defined manner over the upper surface of the substrate 2 and may be moved in a first direction over the substrate 2. Obviously various other structures may be provided which may achieve this purpose. Also, as previously indicated, the substrate 2 may also be held in an upside down manner. In such an arrangement, the cleaning head 5 will have to be arranged in a defined manner below the substrate 2. Also, rather than the cleaning head 5 being supported in a movable manner, to allow a relative movement between the cleaning head 5 and the substrate 2, the cleaning head may be provided in a fixed position and the substrate 2 may be held by a movable support. Obviously, both the cleaning head 5 and the substrate may also be supported by respective movable supports.

The cleaning head 5, which is the key element of the treatment apparatus 1, will explained in more detail with respect to FIGS. 3 to 9, with FIG. 3 showing a schematic bottom view of the cleaning head 5 and FIGS. 4 to 10 showing different schematic views of the cleaning head 5 according to a current design.

As indicated, FIG. 3 shows a schematic bottom view of the cleaning head 5, which is used to explain the general concept of the invention. In FIG. 3, the arrow B next to the drawing indicates the working direction of the cleaning head, i.e. the direction in which the cleaning head 5 will be moved over the substrate 2 during processing. The arrow B, thus, indicates one direction of the double headed arrow A of FIG. 1. The reverse direction is a direction of movement, where the cleaning head 5 is not operated. In case the cleaning head 5 is stationary, the substrate would be moved in a direction opposite to the arrow shown in FIG. 3.

The cleaning head 5, thus, has a leading edge 24 and a trailing edge 26 as well as opposite side edges 28. The leading edge 24 and the trailing edge 26 extend in substance parallel to each other. The side edges 28 also extend in substance parallel to each other, and, thus, the edges form a rectangular shape. The cleaning head 5 has a substantially flat surface 30 of a substantially rectangular shape. The surface 30 has a first extension (width) in the direction of the arrow B (width direction), i.e. extending between the leading edge 24 and the trailing edge 26 and a second extension (length) transverse to the width direction (length direction), i.e. extending between the side edges 28. In operation, the flat surface 30 of the cleaning head 5 will be arranged to face the surface of the substrate 2 to be treated. Thereby, the flat surface 30 of the cleaning head 5 and the surface of the substrate 2 form a gap therebetween, which although open at the radial edge forms a substantially enclosed processing space. In particular, the gap may be adjusted to have a width between about 0.1 mm and 2 mm, while the dimensions of the flat surface 30 are several times larger than the width of the gap, preferably at least times 20 times larger.

Several openings are provided in the surface 30, such as an exhaust opening 32, a radiation opening 34, a plasma exit opening 36 and an outlet or purge opening 38. As shown, the respective openings 32, 34, 36 and 38 each extend parallel to the leading edge 24 and have an extension (width) in the width direction, which is substantially larger than the respective extension (length) in the length direction of the surface 30. The openings are arranged in the following order: exhaust opening 32, radiation opening 34, plasma exit opening 36, and an outlet or purge opening 38 starting from the leading edge 24, to the trailing edge 26. The openings 32, 34, 36 and 38 are spaced from the edges 24, 26 and 28 such that a continuous boundary area is formed around the openings 32, 34, 36 and 38. The boundary area has, preferably, a minimum extension in the width direction and the length direction of about 10 mm such that in each direction, the openings 32, 34, 36 and 38 are preferably spaced by at least 10 mm from the nearest edge.

In FIG. 3, the openings 32, 34, 36 and 38 are shown to be a single opening of a unitary slit-like shape. However, at least the openings 32, 36 and 38 may also be formed by a plurality of openings. The length of the openings in each case, 32, 34, 36 and 38 is defined as the maximum distance between the outer ends of the respective single opening or the outer ends of the outer openings of the plurality of openings in the length direction. The width is defined as the maximum distance between the outer ends of the respective openings in the width direction.

The openings 32, 34, 36 and 38 have different lengths. Preferably, the plasma exit opening 36 has the shortest length corresponding to one dimension of the surface area to be treated. The radiation opening 34 may have a length greater than the plasma exit opening 36. The exhaust opening 32 preferably has a length greater than the radiation opening 34, and the purge opening 38 may have a length greater than the length of the exhaust opening 32. The surface 30 may be formed by a unitary structure such as a plate element having or a unitary housing, which is, for example, formed by 3D-printing. The surface, however, may also be formed by several elements, which are arranged adjacent to each other to form the surface 30. The purpose of these different lengths will be described below when describing an exemplary cleaning operation.

The exhaust opening 32, as the name implies, may be connected to an exhaust device, such as a pump, to allow gas to be drawn through the exhaust opening 32 to be exhausted. Depending on the application in which the cleaning head is used, the exhaust device may have a treatment device for treating any gases prior to being exhausted.

A radiative heater may be arranged in or adjacent to the radiation opening 34 to emit heat radiation through the radiation opening 34. The radiative heater may be of any suitable type to emit suitable heat radiation and may, for example, comprise an elongated resistive heating element. Since the radiation given off by the heating element may not be homogeneous over the entire length thereof, due to edge effects, a central area (in the length direction) may be said to form an active area in which the radiation given off is substantially homogeneous. This active area should have a length which is at least as long as the length of the plasma exit opening 36, while the overall length of the radiative heater and the radiation opening 34 is typically longer. Rather than forming a physical opening in the surface 30, the radiation opening 34 may actually be formed by a plate element, which is flush with the surface 30 but is formed of a material which is substantially transparent to radiation from the radiative heater. However, a physical opening in which the radiation opening is arranged may also be provided. Preferably, the heating element of the radiative heater is arranged as close to, but below, the surface 30 as possible while being separated from a process space by a window element which is in substance transparent to heat radiation generated by the heating element. Such a window element may take several shapes such as a plate shape as described above or a tubular shape surrounding the heating element. The radiative heater may be selected to emit a wavelength which is not well absorbed by the substrate 2, but which is well absorbed by any contaminations thereon. In appropriately selecting the wavelength, heating of the substrate itself may be kept to a minimum while any contaminations may be well heated. Radiation guide elements may be provided to guide at least part of the radiation such that it exits the radiation opening 34, inclined towards the plasma exit opening 36. Although not shown in the drawings, adjacent to the radiant heater, one or more exhaust openings may be provided, which may be connected to the exhaust device to allow gas adjacent to the radiative heater to be drawn therethrough. In so doing, any contamination, which may stem from the radiative heater may be drawn away from the processing space formed when the flat surface 30, and the substrate 2 are arranged to face each other during operation.

The plasma exit opening 36 is connected in a suitable manner to a plasma source 100, such as an RF electrode, which is arranged to emit a plasma jet through the plasma exit opening 36. The plasma source 100 may have a plasma forming space connected to a source of gas, and a source of energy such as an RE-generator for forming a plasma from the gas. An outlet of the plasma forming space 102 is connected to the plasma exit opening 36.

The outlet opening 38 is connected to a gas source for supplying a gas to be emitted through the outlet opening. The gas source is preferably of a type to supply an inert gas such as nitrogen. More than one gas source may be provided to supply different gases as needed.

The respective connections between the openings 32, 36,38, and the exhaust device, the plasma source 100 and gas source may be of any suitable design. Preferably, the connections are such that they promote a flow of gas through the respective opening, which is substantially homogeneous in the length direction of the respective opening.

The exhaust device, the radiative heater, the plasma source 100, and the gas source are each connected to a process controller, which may be configured to control the devices to operate within set process conditions during operation of the cleaning head 5.

Such an exemplary operation and the respective control will be described herein below with respect to the cleaning of a substrate 2 such as a mask for nanoimprint lithography. In particular, contaminations formed by resist residues which may adhere to the mesa area of the mask may be cleaned off the substrate. Such resist residues may, for example, have particle sizes less than 500 nm, which nevertheless may be detrimental in the further use of the mask.

First, the surface 30 of the cleaning head 5 is arranged to face the surface of the substrate 2 to be cleaned with a small gap to form a processing space therebetween. The surface 30 of the cleaning head is arranged such that the exhaust opening is arranged downstream (in the working direction of the cleaning head 5, i.e. the direction in which the cleaning head 5 will be moved over the substrate 2 during processing) of the area to be cleaned. The dimensions of the surface of the substrate 2 and the surface 30 of the cleaning head 5 are preferably selected, such that, during the cleaning process the surface 30 always fully overlaps parts of the substrate 2. With respect to the cleaning of a mesa area of a mask for nanoimprint lithography, this would mean that the area upstream and downstream (in the working direction of the cleaning head) of the mesa area preferably have dimensions approximately equal to or larger than the dimensions of the surface 30 of the cleaning head 5. In cases where an area of the substrate surrounding the area of the substrate to be treated is not sufficiently large, an extending element may be provided adjacent to the substrate to virtually extend the dimensions of the substrate. Such an extending element would have a surface which is substantially flush with the surface of the substrate. In operation, the surface 30 of the cleaning head 5 could then, for example, initially be arranged to overlap both the surface of the substrate, and the surface of the extending device to form the gap.

Once the cleaning head 5 is appropriately located to form the gap and, thus, the processing space, both the exhaust device connected to the exhaust opening 32, and the source of gas connected to the outlet opening 38 are activated. This generates a flow of inert gas flowing from the outlet opening towards, and into the exhaust opening. At the same time or later, the radiative heater and the plasma source 100 are activated and the cleaning head 5 is moved in the working direction over the substrate 2 while maintaining the gap substantially constant. To avoid unwanted surface reactions, such as an oxidation of the surface of the substrate with ambient oxygen, the radiative heater and the plasma should only be activated after the process space has been purged once by the flow of inert gas flowing from the outlet opening towards the exhaust opening. Preferably, the exhaust device is controlled such that the amount of gas drawn into the exhaust opening 32 is approximately equal to the combined amount of gas provided via the plasma exit opening 36, and the outlet opening 38. In some embodiments, the amount of gas drawn into the exhaust opening 32 may be controlled to be slightly higher than the combined amount of gas provided via the plasma exit opening 36, and the outlet opening 38. By appropriately controlling the gas flow out of and into the processing space via the exhaust opening 32, the plasma exit opening 36, and the outlet opening 38, respectively, ingress of ambient gas into the gap or egress of gas from the gap may be avoided or at least supressed to an acceptable limit. Such an acceptable limit is, for example, a limit at which the process to be performed, such as cleaning, is not impaired by the ingress or egress of gas, or the ambient is not contaminated by the egress of gas.

The exhaust device may thus be said to be controlled to exhaust a certain amount of gas from the processing space via the exhaust openings, while the heating element of the radiative heater is controlled to be heated to a target temperature to give off heat radiation at a controlled amount and wavelength. The plasma source may be controlled to generate a plasma jet from a gas, wherein the amount of the gas may be controlled. The gas for forming the plasma jet may be selected from any suitable gas or mixture of gases, and for the above mentioned cleaning of a mask for nanoimprint lithography. He and or N are taken into consideration, although other gases may also be used in this application or other applications. The source of gas may, again, be controlled to emit a controlled amount of gas into the processing space. The gas source is controlled to supply a controlled amount of inert gas into the processing space via the outlet opening 38.

During the movement of the cleaning head 5 over the substrate 2, any area on the substrate to be processed by the plasma will "see" the openings 32, 34, 36 and 38 in the surface 30 in the order exhaust opening 32, radiation opening 34, plasma exit opening 36 and outlet opening. In other words, each area to be processed will experience in the following order: a flow of gas being drawn into exhaust opening 32, radiative heating emitted via the radiation opening 34, a plasma jet emitted from the plasma exit opening 36, and an inert gas flow emitted from outlet opening 38. The radiative heater and the radiation opening 34 may be arranged such that the emitted radiation and the plasma jet interact in substantially the same area within the surface of the substrate.

The cleaning head 5 is moved in the working direction over the substrate 2 with a processing speed of, for example, 0.1 to 0.5 mm/s. Obviously, other speeds may be selected depending on the treatment to be performed. The radiation will (pre-) heat the surface of the substrate or at least the contaminations on the surface of the substrate, and the plasma will decompose the contaminations into gaseous constituents. The (pre-) heating may, for example, heat the contaminations to a temperature of 200° C. or higher which will facilitate their decomposition by the plasma jet. By having the radiation and the plasma jet interact in substantially the same area with the surface of the substrate, cooling off of the contaminations prior to interacting with the plasma jet may be avoided and any heating may be kept local, and limited to the surface of the substrate or the contaminations. In this respect, it should be noted that the flow of inert gas from the outlet opening towards the exhaust opening will provide a cooling effect to the surface of the substrate and the contaminations. The plasma jet will interact with the heated contaminations to decompose the same. The composition of the plasma jet may be selected appropriately with respect to the contaminations to be decomposed or another treatment effect to be achieved.

The flow of inert gas from the outlet opening towards and into the exhaust opening provides cooling for the substrate surface, and ensures that any decomposition products are safely guided to, and drawn into, the exhaust opening. The decomposition products will mix with the inert gas upstream (in the working direction) of the plasma exit opening to be guided towards the exhaust opening. Due to the fact that the exhaust opening and the outlet openings have a length which is larger than the plasma exit opening, the inert gas flow will act as an envelope to supress any flow of the decomposition products towards the sides 28 of the cleaning head.

When the plasma jet has reached the end (in the working direction) of the area to be cleaned, both the radiative heater and the plasma source may be deactivated. At this time, it would be possible to stop the movement of the cleaning head 5, and to deactivate the gas source, and the exhaust device to stop the flow of inert gas from the outlet opening towards and into the exhaust opening. However, for homogeneous process results, it is preferred that the movement and the flow of inert gas from the outlet opening towards and into the exhaust opening is continued until the outlet opening has passed the end of the area to be cleaned. Hereby, it is ensured that each area has experienced, in substance, the same process.

The above process is preferably a single pass process in which the whole area to be cleaned may be processed with a single pass of the cleaning head 5 over the substrate. To allow this, the length of the plasma jet should be as long as or longer than the maximum dimension of the area to be cleaned perpendicular to the working direction of the cleaning head 5. In the example of the mask for nanoimprint lithography, the mesa area may, for example, have dimensions of 33 mm by 40 mm. The plasma exit opening 36 should, thus, have a length of at least 33 mm, and may be set at 40 mm as some inhomogenities may occur at the ends of the plasma jet. The length of the active zone of the radiative heater, i.e. the central region of the heater providing substantially homogeneous radiation, may also be set to 40 mm while the actual radiation opening 34 may be somewhat larger (again to avoid inhomogenities, which may occur at the ends of the radiative heater, influencing the cleaning process). The exhaust opening 32 may, in this example, have a length of, for example, about 75 mm and the outlet opening 38 may, for example, have a length of about 85 mm. Both should be longer than the plasma exit opening 36 to a gas flow envelope towards the sides 28 to be generated. The fact that the outlet opening 38 is slightly longer than the exhaust opening 32 leads to a tapering flow towards the exhaust opening which has been found to be beneficial in maintaining integrity of a process area (i.e. the area where the heating and decomposition of the contaminations takes place) and of the processing space.

While the concept of the invention has been described in a rather general manner with reference to the conceptual drawings of FIGS. 1 to 3, a more specific embodiment of the cleaning head 5 will now described with respect to FIGS. 4 to 10. In these figures, the same reference signs previously utilized will be used for the same or equivalent elements or features. FIGS. 4 and 5 show different perspective views of the cleaning head 5. FIG. 6 shows a side view of the cleaning head 5 and FIGS. 7 to 10 show different sectional views thereof.

As may be seen from the Figures, the cleaning head 5 has a composite housing 40 formed by several housing units 42, 44 and 46. The housing units 42 to 46 are arranged adjacent to each other and are mounted to each other to form the composite housing 40 with housing unit 44 being sandwiched between housing units 42 and 46. One side (the upwards facing side in FIGS. 4 and 5) of the composite housing 40 forms the surface 30 which, although formed by the different housing units 42, 44 and 46, is substantially flat. The housing units 42, 44 and 46 are each made of an appropriate material.

In the following description, surface 30 is considered to be horizontally arranged and facing upwards. When in this position, the housing units 42, 44 and 46 each have a substantially rectangular horizontal cross section, vertically extending sides and a flat bottom. The side of housing unit 42 facing adjacent housing unit 44 has a shoulder at the upper end forming a stepped portion 52 protruding towards housing unit 44. Housing unit 44 has a corresponding negative step at the side facing housing unit 42, to allow the stepped portion 52 of housing unit 42 to partially overlap housing unit 44 at the upper end, as is best seen in FIGS. 4 to 6.

Housing unit 42 is in substance formed by an outer housing element 48, and an insert 50, although, it could also be formed by a unitary housing which is for example formed by 3D printing to achieve the internal structure. The outer housing element 48 has the stepped side facing housing unit 44. Outer housing element 48 also forms a vertically extended channel which is open to the top, bottom and the side opposite the stepped side. In the upper side of stepped portion 52, which forms part of surface 30 of the housing, a recess is formed for accommodating a radiative heater which is indicated at 54 in for example FIG. 7. As described above, the radiative heater 54 may contain an elongated resistive heating element which is surrounded by a tubular member such as a quartz tube, which is, in substance, transparent to heat radiation and may withstand elevated temperatures. Other arrangements are also taken into consideration. Exhaust openings may be provided in the recess, which may be connected to an exhaust device to evacuate the area of the recess to exhaust any products which may outgas from the heating element before such products may leave the recess. Again, other arrangements may be taken into consideration such as providing a purge gas flow within the tube or connecting the interior of the tube to an exhaust device.

The inset 50 of housing unit 42 is dimensioned to closely fit into the channel formed in the outer housing element 48. FIG. 8 shows a cross sectional view of the insert 50, which has an exhaust guide structure 56 which is open to the side facing towards the housing unit 44. The exhaust guide structure 56 is closed by a wall portion of the outer housing element 48, which may be sealed to insert, in any suitable manner, to form internal exhaust guide structure 56 within housing unit 42. The exhaust guide structure has a lower flow space 58 connected via a gas flow passage 60 to a connector 61 for connection to an exhaust device such as a pump. The connector may be of any suitable type of connector for allowing conduit attached to a pump to be connected. The connector is provided on a side of the insert 50. The lower flow space 58 has a substantially rectangular vertical cross section and a main extension in the length direction of the surface 30. The upper flow space 62 has a similar vertical cross sectional shape and is arranged above the lower flow space 58. The upper and lower flow spaces 62, 58 are connected by a central passage 63, which is centrally located in the length direction. Above the upper flow space, a plurality of flow openings 64 are formed in the insert 50, which connect the upper flow space to an exhaust slit 66, corresponding to the exhaust opening 32 in surface 30 as indicated in FIG. 3. In operation, gas which is present above the surface 30, may be drawn by the exhaust device (not shown) into the exhaust slit 66, through the flow openings 64 into the upper flow space 62, via central passage 63 into the lower flow space 58, and from there via passage 60 out of the insert 50. The specific arrangement of the upper and lower flow spaces 62, 58 which are connected by central passage 63, a flow homogenization may be achieved such that in the length direction of exhaust slit 66 is homogeneously drawn in despite the fact that the flow direction out of the insert 50 is to the side, i.e. in the length direction. Other flow homogenizing structures may be provided. Housing unit 44, which is sandwiched between housing units 42 and 46, may be of any suitable design and material to house a plasma generating space (not shown) connected to a gas source (not shown), wherein the plasma generating space is connected to a plasma exit opening 36 provided in surface 30 of composite housing 40. The plasma exit opening 36 may have a slit-like structure having a main extension in the length direction of surface 30, as previously described and may be formed in the upper side of housing unit 44 or as shown right at the interface between housing unit 44, and housing unit 46 as will be described in more detail herein below. The top or the housing unit 44 which forms part of the surface 30 may have a recess of a length corresponding to and adjoining the recess in the stepped portion 52. The recess in the top of housing unit 44 may be inclined such that the deepest point is adjacent to the recess in the stepped portion and the highest point is adjacent to plasma exit opening 36.

FIG. 9 shows a cross sectional view of housing unit 44 at a location where the stepped portion 52 of housing unit overlaps the same. The cross-section shows an internal passage formed in housing unit 44 which is connected to a passage in the stepped portion 52 and the recess formed therein. The passages may be used as guides for an electrical lead for providing power to the radiative heater 54 provided in the recess.

Housing unit 46 is adjacent to housing unit 44, and has a recess provided in its top, forming part of surface 30 of composite housing 40. The recess is directly adjacent to the housing unit 44 and may, for example, be covered by a dielectric material such as a quartz plate. Plasma exit opening 36 is formed right at the interface between housing unit 44 and housing unit 46 in the area of the recess 22 which is not covered by the quartz element.

Spaced from the recess in the top surface of housing unit 46, a row of outlet openings 70 corresponding to outlet opening 38 in FIG. 3 is provided. These outlet openings 70 are each connected to a common flow space 72 as shown in the sectional view of FIG. 10. This common flow space 72 is connected in a suitable manner to a gas source (not shown) such as nitrogen gas. A flow homogenizing structure may be provided in housing unit 46 for providing a substantially homogenous flow of gases (in the length direction of surface) through the outlet openings 70 when the gas source is activated to supply.

At the free end of housing unit 46, i.e. opposite of the housing unit 44, a connector plate 80 is provided which may provide gas and/or energy to the housing unit 44 via appropriate passages in the housing unit 46 to allow the plasma to be formed.

Operation of the cleaning head as shown in FIGS. 4 to 10 is the same as the operation previously described. Although FIGS. 1 to 3 seem to indicate that the surface 30 of the cleaning head 5 is arranged facing downwards to move over the substrate 2, it should be noted that this may be reversed, as previously indicated. In particular when cleaning a mask for nanoimprint lithography, the mask is typically employed in an orientation in which the mesa area is facing downwards. Thus, for the cleaning process, this orientation may be preferably preserved such that it may be cleaned with the mesa are facing downwards. Hence, in this case, the surface 30 of the cleaning head would be arranged to face upwards. Furthermore, in practice it may be preferred to move the substrate 2 over the cleaning head 5 rather than vice versa.

Although the respective openings 32 (66), 34, 36, 38 (70) in surface 30 of the cleaning head are shown to extend parallel to each other transverse to the working direction of the cleaning head, other arrangements may be provided. Even though a parallel arrangement is preferred for a central section of the respective openings, which corresponds to the length of the plasma opening, outside of this central region in particular the exhaust opening and the outlet opening may differ in shape. Such shapes may be selected for optimizing the enveloping effect of the gas flowing from the outlet openings towards the exhaust opening. FIGS. 11 and 12 show some examples of different arrangements of the openings having a central sections which are parallel and FIGS. 13 and 14 show yet different arrangements using the reference signs as previously used.

The invention has been described in detail, and may have been described with particular reference to a suitable or presently preferred embodiment, but it must be understood that variations and modifications can be effected within the spirit and scope of the invention. The presently disclosed embodiments are, therefore, considered in all respects to be illustrative and not restrictive. The scope of the invention is indicated by the appended claims, and all changes that come within the meaning and range of equivalents thereof are intended to be embraced therein.

What is claimed is:

1. A treatment head for treating a surface area of a substrate, the treatment head comprising:
   a housing having a main surface configured to be arranged adjacent to and facing the surface area of the substrate to be treated;
   an exhaust opening in the main surface of the housing, the exhaust opening being connectable to an exhaust device via an exhaust gas path formed at least in part in the housing;
   a radiative heater arranged in the housing to emit heat radiation through a radiation opening in the main surface;
   a plasma source arranged in the housing to emit a plasma jet through a plasma exit opening in the main surface; and
   an outlet opening in the main surface of the housing, the outlet opening being connectable to a gas source via a gas path formed at least in part in the housing, wherein centers of the exhaust opening, the radiation opening, the plasma exit opening and the outlet opening are arranged in the above order along a first direction of the main surface.

2. The treatment head of claim 1, wherein the exhaust opening, the radiation opening, the plasma exit opening and the outlet opening each have a width in the first direction of the main surface and a length in a second direction of the main surface, wherein the second direction is perpendicular to the first direction, wherein the length of each opening is larger than its width; and wherein the length of each opening is defined as a distance between its outer ends in the second direction and the width of each opening is defined as a distance between its outer ends of the in the first direction.

3. The treatment head of claim 2, wherein at least one of the exhaust opening and the outlet opening is formed by a plurality of openings arranged adjacent each other.

4. The treatment head of claim 2, wherein the length of the exhaust opening and the length of the outlet opening are each longer than the length of the plasma exit opening.

5. The treatment head of claim 2, wherein at least a center portion of the exhaust opening, the radiation opening, the plasma exit opening and the outlet opening extend parallel to each other in the second direction, the center portion having a length corresponding to the length of the plasma exit opening.

6. The treatment head of claim 1, wherein at least one of the exhaust opening and the outlet opening at least partially overlaps at least one of the radiation opening and the plasma exit opening in the first direction.

7. The treatment head of claim 1, wherein at least one of the exhaust opening and the outlet opening have a U-shape, a V-shape or a combination thereof.

8. The treatment head of claim 1, wherein the main surface of the housing is substantially flat.

9. The treatment head of claim 1, wherein the main surface of the housing has a surface contour matching a surface contour of the surface area of the substrate.

10. The treatment head of claim 1, wherein the radiative heater and the radiation opening are arranged such that at least part of the radiation exiting the radiation opening is inclined towards the plasma exit opening.

11. The treatment head of claim 1, wherein the main surface of the housing of the treatment head has an extension in a direction perpendicular to the first direction which is larger than an extension of the surface area of the substrate to be cleaned in the direction perpendicular to the first direction.

12. The treatment head of claim 1, wherein the treatment head is configured to clean the surface area of the substrate, wherein the radiative heater and the plasma source are configured to locally provide sufficient heat and plasma energy to decompose any matter to be removed from the surface area of the substrate to be cleaned.

13. A treatment system for treating a surface area of the substrate, the treatment system comprising:
   a treatment head of claim 1; and
   a holder for holding the substrate to be treated;
   a movement mechanism configured to move at least one of the holder and the treatment head to place the treatment head in close proximity to a surface area of the substrate to be treated and to provide a scanning movement between the treatment head and the substrate to be treated at least along a main scan direction corresponding to the first direction of the main surface and in substance parallel to the surface of the substrate to be treated.

14. The system of claim 13, wherein the holder is configured to hold the substrate such that the surface area of the substrate to be treated faces downwards and is freely accessible.

15. The system of claim 13, wherein the movement mechanism is configured to move the holder along the main scan direction.

16. A method of treating a local surface area of a substrate to be treated, the method comprising:
   placing a treatment head having a main surface adjacent to and facing the local surface area of the substrate to be treated, such that a substantially uniform gap is formed between the surface and the local surface area to be treated;
   providing a scanning movement along a scan direction between the treatment head and the substrate to be treated while maintaining the gap;
   treating the local surface area during the movement along the scan direction by sequentially exposing the local surface area to the following in the gap:
   a gas flow into an exhaust opening provided in the main surface of the treatment head, the gas flow causing a suction force on the local surface area to be treated;
   radiative heat emitted from a radiation opening provided in the main surface of the treatment head towards the substrate to be treated, the radiative heat causing local heating of the local surface area to be treated;
   a plasma jet emitted from a plasma exit opening provided in the main surface of the treatment head towards the local surface area to be treated; and
   a purge gas flow provided from an outlet opening provided in the main surface of the treatment head into the gap.

17. The method of claim 16, wherein the treatment head comprises a housing having a main surface configured to be arranged adjacent to and facing the surface area of the substrate to be treated;
   an exhaust opening in the main surface of the housing, the exhaust opening being connectable to an exhaust device via an exhaust gas path formed at least in part in the housing;
   a radiative heater arranged in the housing to emit heat radiation through a radiation opening in the main surface;
   a plasma source arranged in the housing to emit a plasma jet through a plasma exit opening in the main surface; and
   an outlet opening in the main surface of the housing, the outlet opening being connectable to a gas source via a gas path formed at least in part in the housing, wherein centers of the exhaust opening, the radiation opening, the plasma exit opening and the outlet opening are arranged in the above order along a first direction of the main surface.

18. The method of claim 16, wherein the main surface of the treatment head is substantially flat.

19. The method of claim 16, wherein the gas flow into the exhaust opening and the purge gas flow from the outlet opening are controlled to capture all gas flow emitted by the plasma jet.

20. The method of claim 16, wherein the gap is controlled to be between 0.1 mm and 2 mm.

21. The method of claim 16, wherein the scanning movement of the treatment head is controlled such that during the treatment the main surface of the head does not move beyond the local surface area of the substrate or a surface extension, the surface extension being an element provided adjacent to the substrate, and which forms a substantially flush surface with the local surface area of the substrate.

22. The method of claim 16, wherein the treatment is a cleaning of the local surface area of the substrate and the radiative heat and the plasma jet are controlled to locally provide sufficient heat and plasma energy to decompose matter to be removed from the local surface area to be cleaned.

23. The method of claim 16, wherein the method is for cleaning a mesa area of a mask for nanoimprint lithography.

24. The method of claim 16, wherein the treatment is one of a deoxygenation and passivation using at least one of hydrogen and nitrogen as gas for forming the plasma jet.

25. The method of claim 16, wherein the treatment is an oxidation process by means of Ozone, which is generated using oxygen as gas for forming the plasma jet.

26. The method of claim 16, wherein the treatment is a high energy decomposition process by means of metastables, which are generated using Helium, Argon, Nitrogen or a mix of those gases for forming the plasma jet.

* * * * *